(12) United States Patent
Garner et al.

(10) Patent No.: US 7,129,493 B2
(45) Date of Patent: Oct. 31, 2006

(54) METHOD AND APPARATUS FOR PHOTOVOLTAIC CELLS OF SOLAR POWERED RADIATION SENSING SYSTEM ANTENNA

(75) Inventors: William R. Garner, San Diego, CA (US); Jonathan M. Luck, El Cajon, CA (US)

(73) Assignee: Ambient Control Systems, Inc., El Cajon, CA (US)

( * ) Notice: Subject to any disclaimer, the term of this patent is extended or adjusted under 35 U.S.C. 154(b) by 199 days.

(21) Appl. No.: 10/898,640

(22) Filed: Jul. 23, 2004

(65) Prior Publication Data

US 2005/0001167 A1   Jan. 6, 2005

Related U.S. Application Data

(63) Continuation-in-part of application No. 10/492,155, filed as application No. PCT/US02/32242 on Oct. 10, 2002.

(60) Provisional application No. 60/328,436, filed on Oct. 10, 2001.

(51) Int. Cl.
    *G01J 5/02* (2006.01)
(52) U.S. Cl. ..................................................... 250/347
(58) Field of Classification Search ................ 250/347; 343/720
    See application file for complete search history.

(56) References Cited

U.S. PATENT DOCUMENTS

| 4,982,176 A | 1/1991 | Schwarz |
| 5,162,658 A | 11/1992 | Turner et al. |
| 5,229,649 A | 7/1993 | Nielsen et al. |
| 5,661,349 A | 8/1997 | Luck |
| 5,726,451 A | 3/1998 | Ishida et al. |

FOREIGN PATENT DOCUMENTS

| DE | 19954259 A1 | * | 5/2001 |
| JP | 07015230 A | * | 1/1995 |
| JP | 2000165128 A | * | 6/2000 |
| JP | 2001267836 A | * | 9/2001 |
| JP | 2001320224 A | * | 11/2001 |

* cited by examiner

Primary Examiner—Constantine Hannaher
(74) Attorney, Agent, or Firm—Crowell & Moring

(57) ABSTRACT

A method and apparatus for integrating photovoltaic cells into a ground plane of satellite and terrestrial antenna systems is disclosed. The system provides an increase in available surface area for power generation without increasing the overall size. In one embodiment, a substrate has both photovoltaic cells and a conductive spacer formed on one side, where the conductive spacer has a thickness substantially equal to the thickness of the photovoltaic cells. In another embodiment, an antennae element may be formed on the top side of the conductive spacer, where the photovoltaic cells form a ground plane for the antenna element.

20 Claims, 7 Drawing Sheets

METHOD AND APPARATUS FOR PHOTOVOLTAIC CELLS OF SOLAR POWERED RADIATION SENSING SYSTEM ANTENNA

CROSS REFERENCE TO RELATED APPLICATION

This application is a continuation-in-part of U.S. application Ser. No. 10/492,155, filed Apr. 9, 2004, which based upon PCT International Application No. PCT/US02/32242, filed Oct. 10, 2002, which claims the benefit of U.S. Provisional Application Ser. No. 60/328,436, filed Oct. 10, 2001.

BACKGROUND OF THE INVENTION

1. Field of the Invention

The invention relates generally to ground planes of antenna systems, and more particularly to a ground plane which comprises photovoltaic cells in one embodiment.

2. Description of Related Art

Solar-powered remote instrumentation packages which communicate by satellite or terrestrial radio links have limitations on their available surface area for the necessary photovoltaic arrays and the associated radio frequency (RF) ground plane required by the radio link electronics. The capability of a photovoltaic array to generate power is a function of the ambient light level and area of the array. It is often the case that the available surface area for mounting photovoltaic cells on a piece of equipment is limited by the operational requirements of the equipment, particularly when the equipment is required to have one or more wireless communication links necessitating an antenna or a series of antennae. Many of these antennae require ground planes to achieve the desired performance. However, the area required by these ground planes reduces the available area for photovoltaic cell coverage. Thus, there is a need for a method and apparatus which overcomes this problem.

SUMMARY OF THE INVENTION

Disclosed and claimed herein are methods and apparatus for photovoltaic cells of solar powered radiation sensing system antenna. In one embodiment, a photovoltaic module comprises a substrate, a plurality of photovoltaic cells formed on one side of the substrate, and a conductive spacer element formed on the same side of the substrate as the photovoltaic cells. In one embodiment, the conductive spacer has a thickness which is substantially equal to a thickness of each of the plurality of photoconductive cells. The module further comprises an antenna element formed on the conductive spacer, wherein the side of each of the plurality of photovoltaic cells away from the substrate together form a ground plane for the antenna element.

Other aspects, features, and techniques of the invention will be apparent to one skilled in the relevant art in view of the following detailed description of the invention.

DETAILED DESCRIPTION OF EXEMPLARY EMBODIMENTS

One aspect of the present invention is to provide a method and apparatus whereby photovoltaic cells may be integrated into the ground plane of satellite and terrestrial antenna systems. In one embodiment, this results in an increase in the available surface area for power generation without increasing the overall system size. In another embodiment, or in addition to the previous embodiment, photovoltaic cells can be used to make up the ground plane of communication antennas in order to allow the ground plane itself to be able to generate usable power for remote equipment. Such remote equipment may, for example, be of the type which uses radiation sensitive sensors to detect physical phenomenon in an unattended manner.

A photovoltaic module, consistent with the principles of the invention, may include a substance with photovoltaic cells formed on one side of the substrate. A conductive spacer having a thickness equal to the thickness of the cells may also be formed on the same side of the substrate, according to one embodiment. In another embodiment, or in addition to one or more of the previous embodiment, an antennae element may be formed on the conductive spacer on the side of the cells away from the substrate to form a ground plane for the antenna element.

Figure 1:
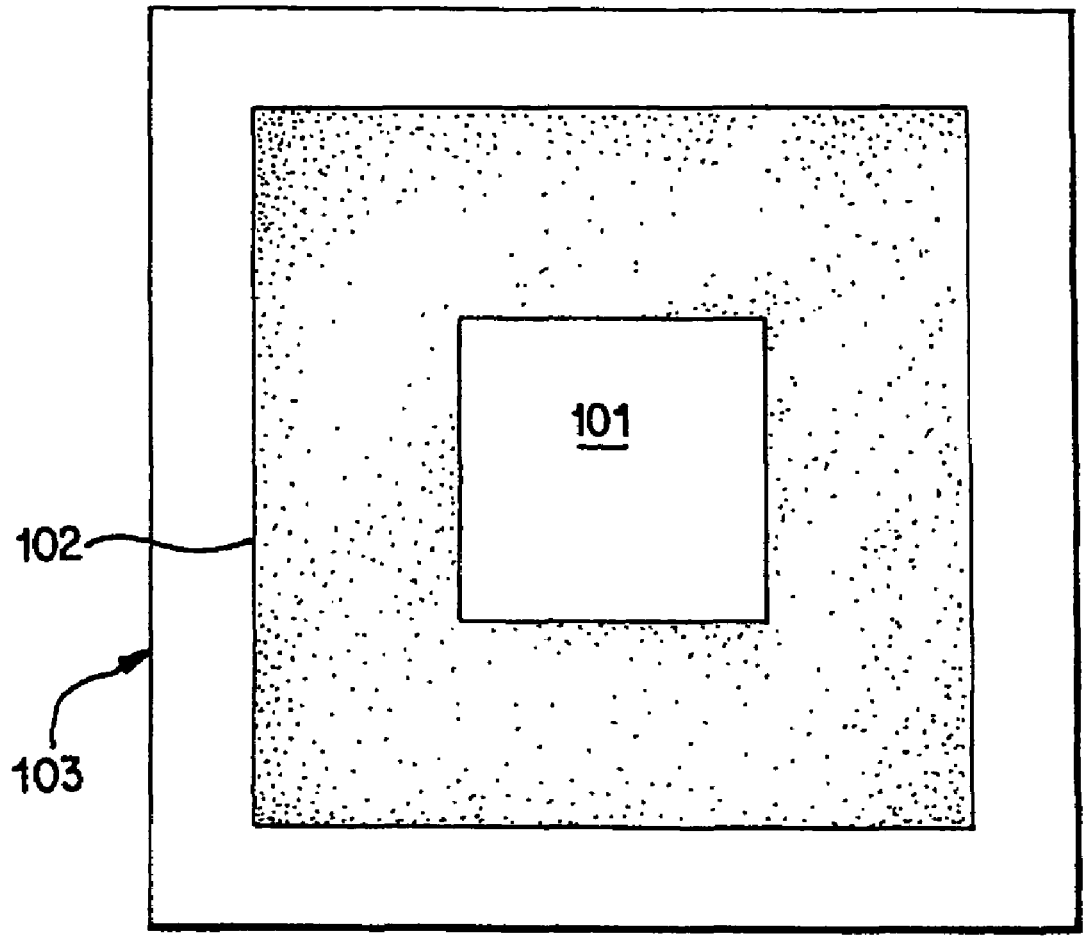
FIG. 1 illustrates a typical construction and design for a patch antenna ground plane of the prior art.

Referring now to FIG. 1, depicted is a ground plane design for a typical patch antenna 101. The patch antenna 101 is shown as being mounted on a conductive ground plate 102 which is, in turn, mounted on a rigid non-conductive substrate 103. Typically a copper ground plane is etched on a printed circuit board for such a design. Although shown as a patch antenna, the antenna could be of any type that requires a ground plane for proper operation. According to normal requirements of the industry, the area occupied by the ground plane is separated from the area used by photovoltaic panels (not shown in FIG. 1). This obviously reduces the available power generation capacity for a system where the overall surface area is limited by design constraints.

Figure 2:
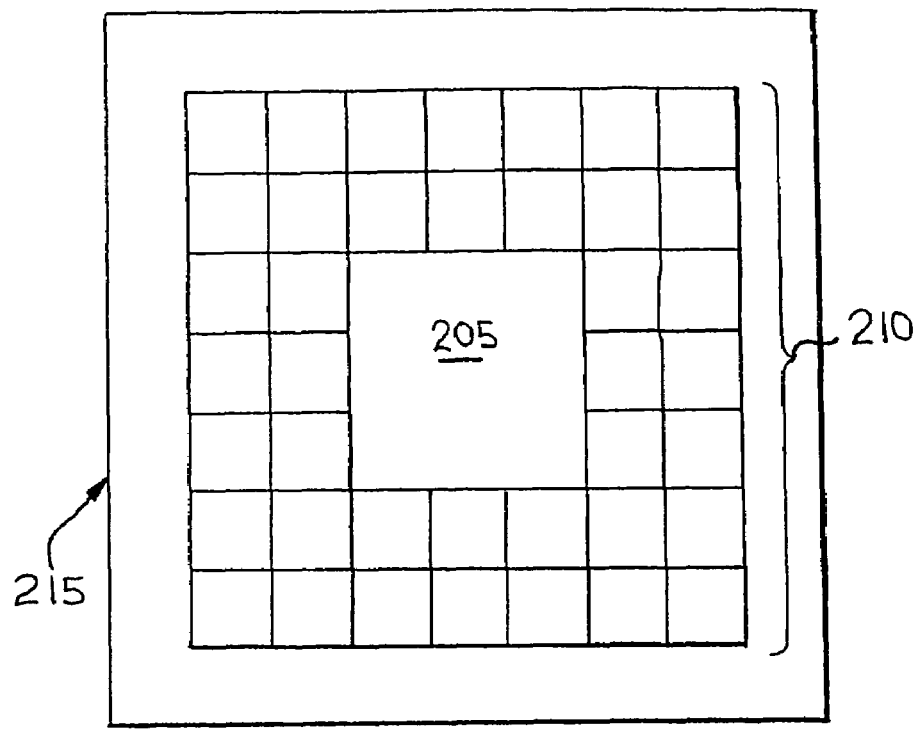
FIG. 2 illustrates one embodiment of a patch antenna mounted on a ground plane constructed of a series of photovoltaic cells, consistent with the principles of the invention.

FIG. 2 depicts one embodiment of an antenna 205 mounted on a ground plane constructed of a series of photovoltaic cells 210, consistent with the principles of the invention. In this embodiment, these cells 210 have been mounted on a rigid substrate 215, such as a printed circuit board. The top side of the photovoltaic cells 210 may act as a ground plane for the antenna 205. In one embodiment, any interconnection circuitry required among the photovoltaic cells 210 may be positioned on the opposite or back side of the substrate 215. It should be appreciated that the antenna 205 may be a patch-type antenna, or may be any other type of antenna which makes use of a ground plane.

Figure 3:
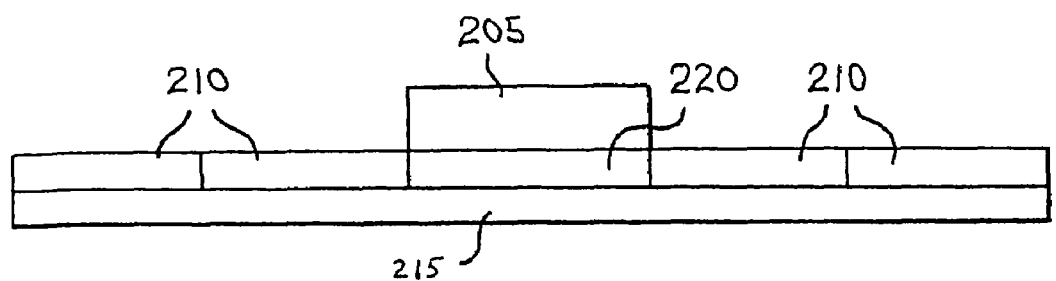
FIG. 3 is a cross section of the photovoltaic ground plane of FIG. 2.

A cross-sectional view of the photovoltaic ground plane of FIG. 2 is shown in FIG. 3. In this embodiment, the antenna 205 has been mounted on the non-conducting substrate 215 by a conductive spacer 220. The spacer 220 is shown as having approximately the same thickness as the surrounding photovoltaic cells 210 such that the bottom surface of the antenna 205 is substantially coplanar with the top conductive layer of the photovoltaic cells 210. It should be appreciated that the top conductive layer of the photovoltaic cells 210 may depend on the specific construction of the cell with any interconnecting circuitry potentially being mounted on the bottom of the substrate 215. In one embodiment, the conductive spacer 220 may be a copper slug having substantially the same thickness as the photovoltaic cells 210.

Figure 4:
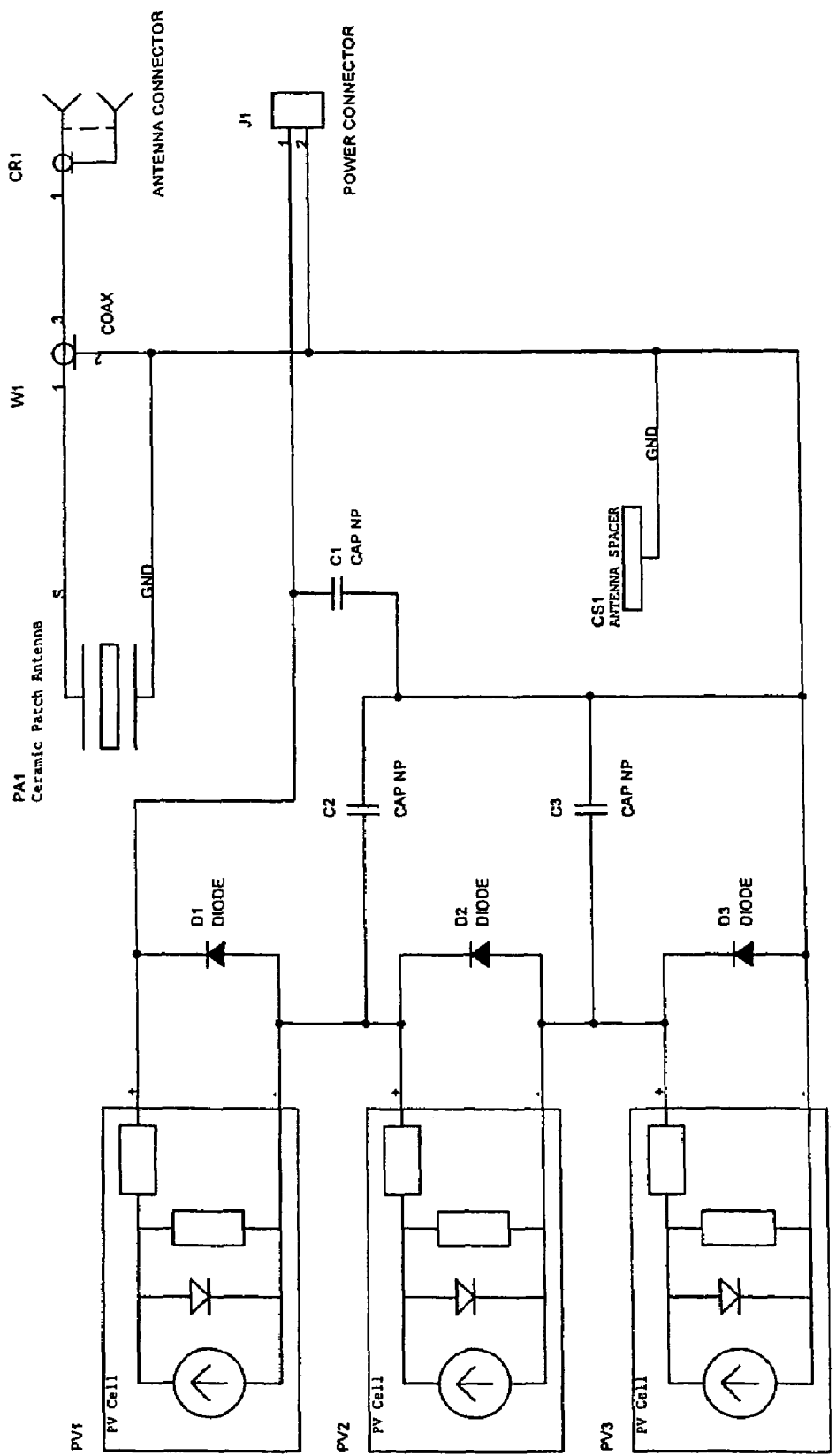
FIG. 4 is one embodiment of an electrical schematic showing connection of photovoltaic cells in an antenna structure, consistent with the principles of the invention.

Referring now to FIG. 4, depicted is one embodiment of a schematic diagram showing the relationship between the photovoltaic cells 210 and the antenna 205. In the embodiment of FIG. 4, three solar cells (PV1–PV3) each have a negative side connected to ground through capacitors C1–C3, respectively. In one embodiment, capacitors C1–C3 function to ensure that the metallization layers of all the solar cells PV1–PV3 are at the same potential for the RF frequencies of operation. Also in the embodiment of FIG. 4, attached to ground is the ground side GND of antenna 205, which in this embodiment is ceramic patch antenna PA1. The top (signal) side of the patch antenna PA1, labeled as S, is depicted as being attached to a coaxial cable. In one embodiment, the copper antenna spacer, CS1, causes the bottom of the patch antenna to be at essentially the same level as the top of the solar cell.

Figure 5:
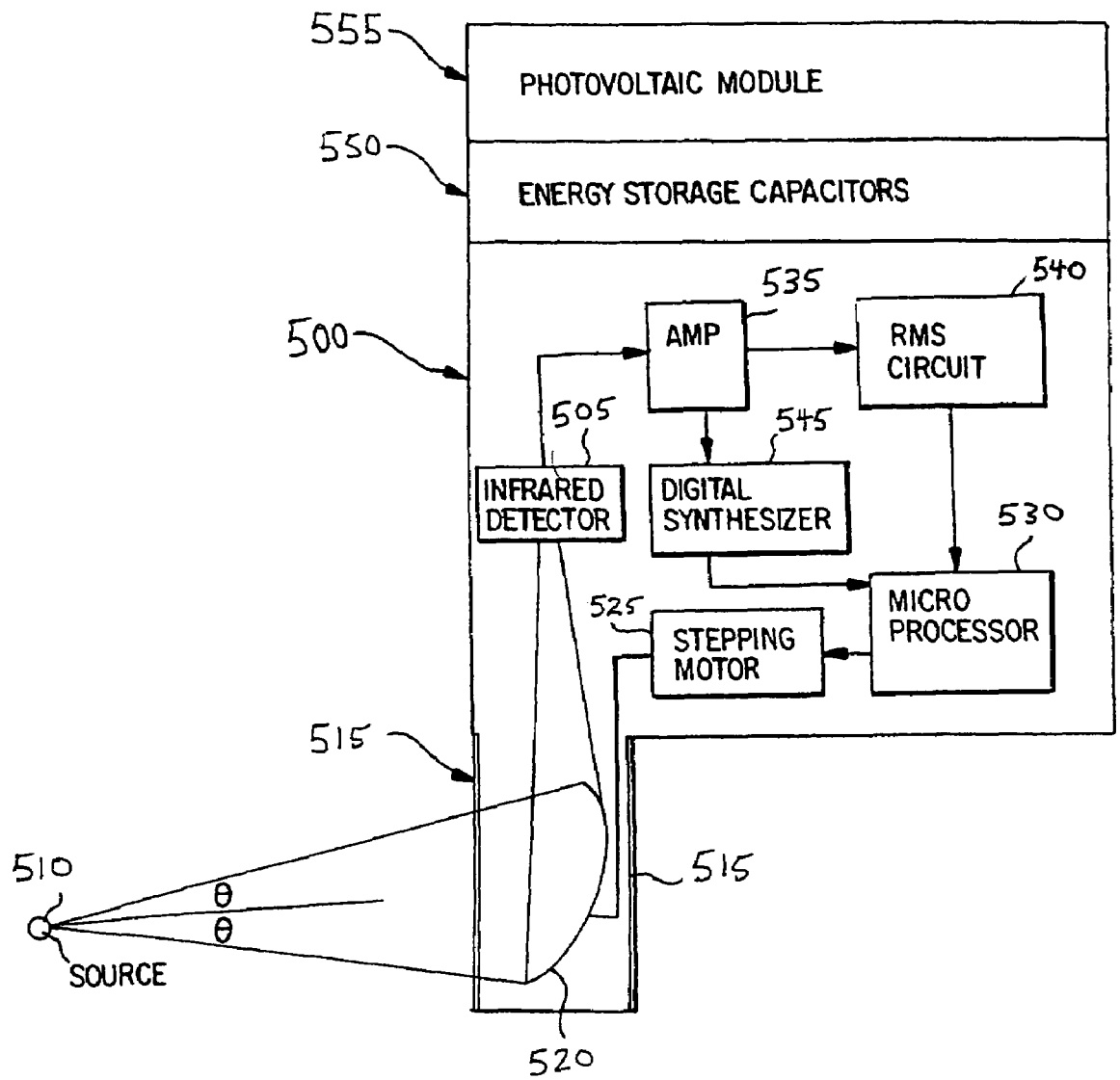
FIG. 5 is a function diagram of one embodiment of a sensor unit which implements one or more aspects of the invention.

It should be appreciated that the photovoltaic ground plane of FIG. 2 may be implemented in a myriad of different applications. One such application is an outdoor radiation sensor system. In particular, the photovoltaic ground plane of FIG. 2 may be utilized in the communication antenna for a remotely-located radiation sensor, which may be either satellite or terrestrial based. For example, the sensor system 500 of FIG. 5 illustrates one such system which may implement one or more aspects of the invention.

Sensor system 500 is a microprocessor-based sensor system having a single infrared radiation (IR) detector 505 receiving radiation from source 510 passing through sapphire window 515 and reflected by rotatable mirror 520. The mirror 520 provides 360° rotation in increments of 6 degrees, for example, by control of the stepping motor 525. The vertical angle 2θ has a magnitude determined by the sapphire window 515 and the vertical distance covered by the length of mirror 520. In a typical embodiment 2θ covers approximately 90 degrees which, when sensor 500 is positioned in the forest environment, it's typically +45 and −45 degrees from the horizontal.

For determining fire, radiation is detected in a narrow frequency band with a band pass centered at approximately 4.3 micrometers in the infrared (IR). The sensor system 500 provides this narrow band sensitivity by using a detector 505 having a silicon window covered with two separate optical coatings. Each coating has a separate but overlapping pass band. Additionally, there is a separate sapphire window which itself has a radiation pass band. The basis for detection of a fire is the emission of the $CO_2$ at 4.3 micrometers while normal atmospheric $CO_2$ is absorptive at this particular wavelength. Therefore, detection of a large signal at 4.3 micrometers is suggestive of a fire.

In order to distinguish spurious signals from 4.3 micrometer radiation of the type which may be due to sun reflection or radiation emissions from heated $CO_2$ not arising from an incipient forest fire, it is necessary to detect whether the 4.3 micrometer signal has a "flicker" frequency between 1 and 10 hertz which is uniquely indicative of fire. Additionally, a RMS (Root Mean Square) or similar signal strength analysis of the output of the detector 505 provides for an initial determination of whether a fire has been detected.

Still further discrimination is necessary to determine whether the fire is a forest fire or a campfire or a hiker mischievously holding a lit cigarette lighter in front of the radiation sensor. This further discrimination is necessary so as to eliminate chances of false alarms. This additional discrimination is based on a digital frequency analysis of the output of the IR detector. Both these methods of discrimination are taken into consideration during the scanning by the stepper motor 525 under the control of the microprocessor 530.

Figure 6:
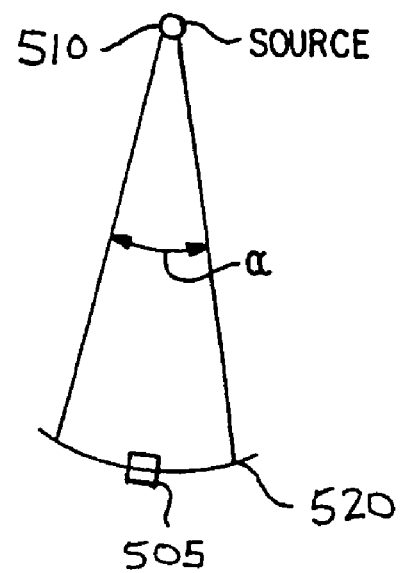
FIG. 6 is a sketch of a top view of FIG. 5 illustrating one embodiment of rotation in the horizontal plane.

Via the scanning mechanism, the sensor signals from detector 505 for each six degree increment are smoothed by averaging, creating a background baseline reference. During each step the output of detector 505 is amplified at 535 and then analyzed by microprocessor 530 after being processed by the root mean square circuit 540. As shown in FIG. 6, each step of the mirror covers an angle α in the horizontal direction. With each subsequent step, an additional six degrees is covered, until a full 360° circle is accomplished.

The microprocessor controls the analysis of the detection for each six degree segment so that the length of time for each six degree analysis is one second. However, actual detection only takes place after a "settling in" period. That is, every second contains an approximately 0.3 second segment during which the new position is "settled in" in order for the received infrared signal through the sapphire window to the detector to adjust to the particular level. Then RMS analysis occurs for the remaining approximately 0.7 seconds before moving to the next increment of six degrees so that for every one minute the entire 360° is swept. The RMS conditioner 540 provides this signal of the microprocessor 530.

If one of the segments provides an RMS indication of $CO_2$ at a predetermined level above the base line, the microprocessor flags this segment and subsequently examines the same segment for a similar RMS indication. If two occurrences exist in the same segment, digital frequency analysis is performed by the microprocessor for a longer period of time in order to provide further analysis. This further analysis is instrumental in determining if the detected event is a fire requiring the output of an alarm signal. The digital frequency converter 545 provides this signal to the microprocessor 530.

The sensor assembly begins operation by stepping the mirror 520 through a sequential series of 6° steps with each step having a duration of one second and with each second being divided into a 260 millisecond segment during which time no detection occurs. This 260 millisecond time period allows for mechanical stability of the mirror at its new incremented position and also allows for balancing the received infrared signal and allowing it to reach its quiescent state. Subsequently, during the next 740 millisecond 20 sample signals are taking with each sample requiring 37 milliseconds. These output samples are fed through amplifier 535 to the RMS conditioner 540 under the control of the microprocessor 530. The amplifier 535 is a low frequency amplifier having a passband between approximately 1 and 10 Hertz. These frequencies are uniquely associated with fire.

The RMS value of the sample is determined and is averaged with previous signals from other increments to provide a baseline RMS signal. If the RMS value of the signals obtained during the 740 millisecond of a particular segment exceed the "background RMS value" by a predetermined amount, a flag is attributed to the particular segment. For purposes of discussion, the segment under study will be considered as Segment X. After examining Segment X the stepping motor 525 is incremented to the next segment X plus 1 where the same sequence of detection occurs. The new signal values are added to the averaging process in order to update the background RMS. Once again, if the 20 sampler exceeds the "background RMS value" by the predetermined amount, a flag will set for the X+1 segment. In the first sweep through the 360°, each increment occupies one second regardless of whether a flag has been assigned to any segment. Once a full sweep has been completed, at the end of one minute, a second sweep begins and if the detected values at segment X on the second sweep once again provides a RMS value greater than the background RMS value by the predetermined amount, a second flag is assigned to position X. Once this second flag is assigned, the mirror remains fixed for a time beyond the one second in order to provide digital frequency analysis. In other words, the signals received from the detector 505 are subject to digital frequency processing by the digital frequency converter 545 and the microprocessor 530 for an extending period of time during which there is no incremented movement of the mirror from the position X. This period of time may extend up to three minutes in order to provide a detailed examination of the radiation entering at position X. If the results of the digital frequency analysis, caused by the system's reaction to the frequency of "flicker" of the fire, exceed a predefined criteria, an output alarm signal is sent from sensor system 500 by means of a radio or satellite modem to a central location. The microprocessor has an associated memory (e.g., software non-volatile memory 531) having a program with stored characteristics of forest fires which serves as the predefined criteria of flicker frequency analysis to be compared with the output of the Digital Frequency converter 545.

On the other hand, if the result of the digital frequency analysis is such that no incipient fire is indicated at that time, the second flag is removed and the mirror moves to the next segment position to once again employ the "one second" analysis at each segment. That is, the mirror will not stop and begin digital frequency analysis until the particular position has two flags associated with it. As a further example, if a position "X+1" has a detection of a signal which exceeds a background RMS value by the predetermined amount, it will also have a flag associated with it and on the next sweep, if the signal from "X+1" once again exceeds the RMS average by the predetermined amount, a second flag will be indicated for position X+1 and subsequently digital frequency analysis will be performed.

Scanning continues after digital frequency analysis or digital signal processing has been completed regardless of whether or not a fire is indicated at the particular position examined. This allows for analysis of the spread of the fire to different segments and enables detection of the direction in which the fire is spreading. The output signals from the sensor system are able to indicate the presence of a fire as well as provide, on a continuing basis, necessary information to the fire control base station (discussed below) concerning the movement of the fire.

The output signal of the detector 505 is, as indicated above, digitized and interpreted by matching actual samples progressively received to historical and patterns for the evolution of real world forest fires. A single detector 505 sweeps a 360° area in a continuous manner using narrow band optics, mechanical scanning, signal averaging and digital signal processing provides a system which is both reliable, inexpensive and easily adaptable to large areas.

Detector 505, is, for example, a pyro-electric detector of single element construction having a 4.4 micrometer pass band accomplished with two optical coatings on a silicon window. This detector is available from Hamamatsu Corporation as model number P3782-12. Power is supplied to storage supercapacitors 550 by Photo-voltaic module (PVM) 555, which may function, for example, in accordance with the energy management system described in U.S. Pat. No. 5,661,349.

Figure 8:
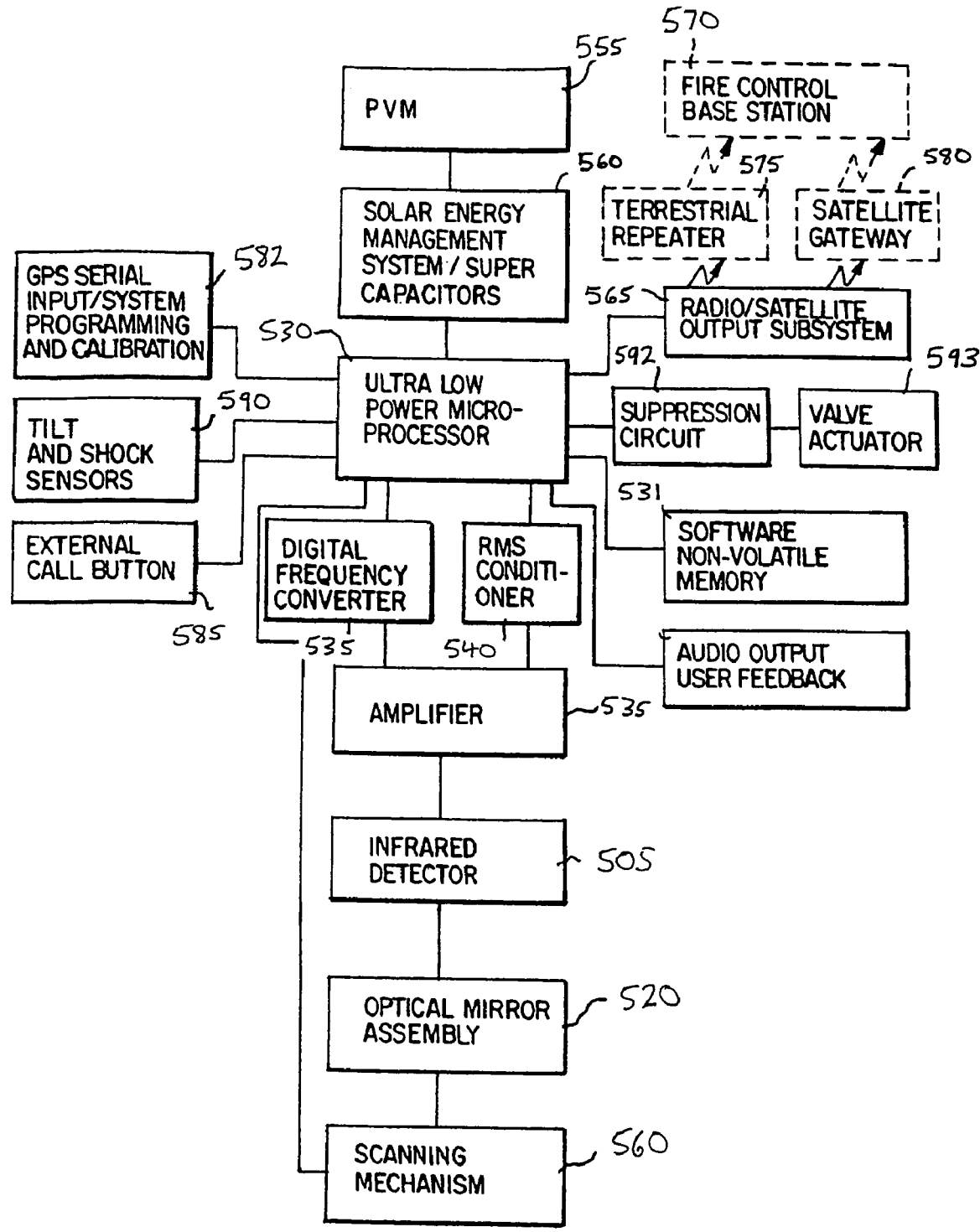
FIG. 8 is a block diagram functionally describing one embodiment of the sensor unit of FIG. 5.

The block diagram of FIG. 8 illustrates the various inputs, outputs and structural components of a system within the sensor system 500 of FIG. 5. In addition to the scanning mechanism 560, the infrared detector 505, the analog amplifier 535, the RMS conditioning circuit 540 and the digital frequency converting circuit 545, a solar energy management system 560 (which may include supercapacitors 550) may function, for example, in accordance with the energy management system of U.S. Pat. No. 5,229,649. Output signals from the sensor system 500 are sent out through the radio/satellite modem output subsystem 565 to the fire control base station 570 terrestrially through a radio repeater 575 or by way of a Satellite to a Satellite Gateway 580.

The location of the sensor system 500 is determined based upon the GPS location information programmed into the system via GPS serial input 582. In another variation, the sensor system 500 can include an external call button 585 which can be depressed by a human to cause a radio signal to be sent. The system would then serve as a "call box" for injured or last hikers, woodsmen, and or others such as fireman in trouble who may have occasion to require aid or make other approved or prearranged signals to a central location. Additionally, the fire system sensor can be set up so that it is normally put into an alarm mode based on vandalism or tilt event. The tilt and shock sensors 590 provide the mechanisms for such an alarm system.

In addition to providing notification of forest fires, the system is equally adaptable at providing indications of fires within confined or specific areas by an alarm actuation as well as actuation of a suppression system such as water sprinkler system, a gel system or a foam system. In one embodiment, microprocessor 530 may direct suppression circuit 592 to activate valve actuator 593. Because of the above described scanning function accomplished by the signal fixed element which continues to scan after an initial detection of fire, the system is able to not only indicate the beginning of a fire, but also when a fire ceases to exist. This can be particularly useful with respect to a water sprinkler system which, in the prior art, continues to operate until a shut-off is manually performed, sometimes many hours after the fire has occurred. In most environments, when a fire occurs and a sprinkler system is set off, the major damage is due to water caused by the continuous sprinkler operation. Using this detector, with its ability to continue scanning after the beginning of a fire, allows for not only the output of the signal to initiate the water sprinkler system, a foam system or a gel system (e.g., via valve actuator 593), but also to shut off the suppression system when the fire is extinguished.

This system allows for the control of a two-way valve to facilitate control of a sprinkler/foam/gel system. The control of the two way valve is affected through an electromechanically actuated latching solenoid (e.g., valve actuator 593) that is controlled by signals from sensor system 500 via suppression circuit 591, for example. The system may be wired directly to the sprinkler actuator or it may be set up for remote operation. It is also an advantage of this system that the sensor continues to scan even after a fire is extinguished so that, a sprinkler system, foam system or gel system can be reactivated if the fire reoccurs. Additionally, the ability to shut off the foam/gel system allows for saving foam/gel because such systems have a limited storage capacity.

Figure 9:
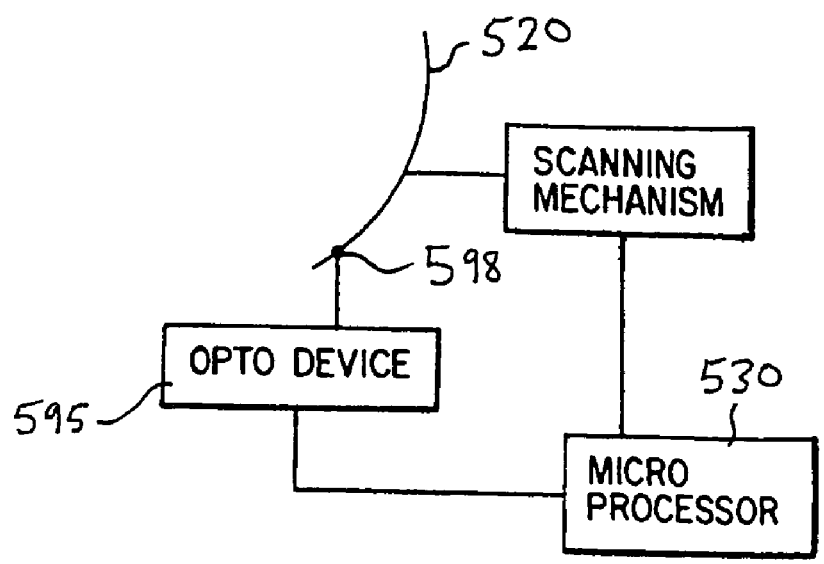
FIG. 9 schematically illustrates one embodiment of directional calibration of the sensor unit of FIG. 5.
Figure 7:
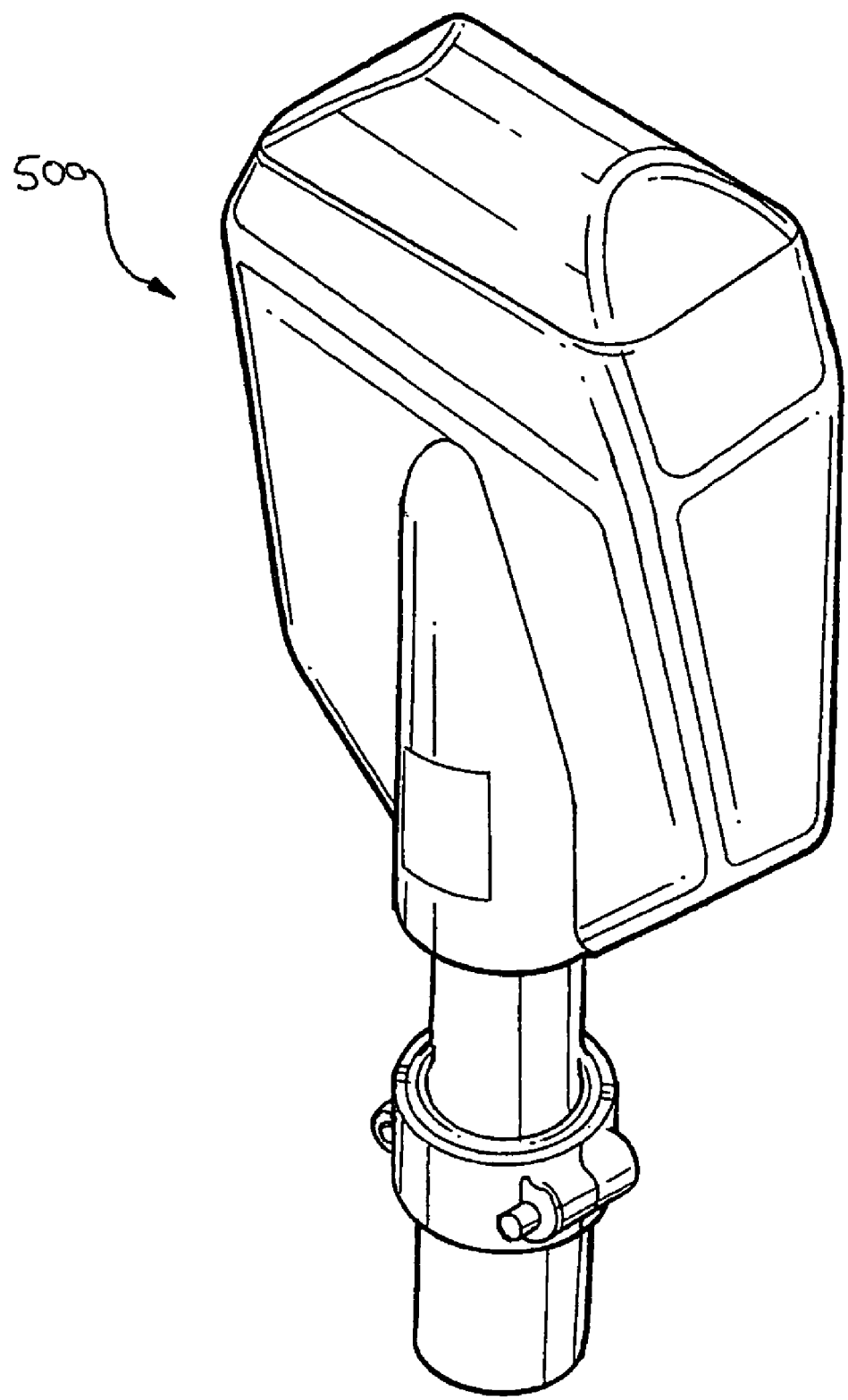
FIG. 7 depicts one embodiment of the exterior of a unit constructed in accordance with FIG. 5.

Orientation calibration of the sensor can be accomplished, for example, using the opto device 96 shown in FIG. 9 in association with the mirror 520. The opto device 595 include an optical sensor which directs light toward the spot 598 and receives the reflected light. This spot 598 may be made of gold or some other material providing precise reflection to the opto device 595. The opto device 595 is used to calibrate the mirrors rotational position and provides such information to the microprocessor 530. Alignment to magnet north can now occur by rotating the mirror an additional number of steps until the mirror is pointing at magnetic North. This additional number of steps past the calibration point is stored by the microprocessor such that true fire bearing can be sent in an alarm situation. Other forms of self calibration with respect to North may be substituted.

While the preceding description has been directed to particular embodiments, it is understood that those skilled in the art may conceive modifications and/or variations to the specific embodiments described herein. Any such modifications or variations which fall within the purview of this description are intended to be included herein as well. It is understood that the description herein is intended to be illustrative only and is not intended to limit the scope of the invention.

The invention claimed is:

1. A photovoltaic module, comprising:
   a substrate;
   a plurality of photovoltaic cells formed on a first side of said substrate:
   a conductive spacer element formed on the first side of said substrate, said conductive spacer having a thickness which is substantially equal to a thickness of each of said plurality of photovoltaic cells; and
   an antenna element formed on said conductive spacer, wherein a side of each of said plurality of photovoltaic cells away from said substrate together form a ground plane for said antenna element.

2. The module according to claim 1, further including interconnecting circuitry formed on a second side of said substrate to interconnect said plurality of photovoltaic cells.

3. The module according to claim 1, wherein said antenna element is a patch antenna element.

4. The module according to claim 1, wherein said conductive spacer is a copper spacer.

5. The module according to claim 1, wherein said conductive spacer and said antenna are essentially centrally positioned among said plurality of photovoltaic cells.

6. The module according to claim 1, wherein each of said photovoltaic cells are connected to ground through a respective capacitance element in order to provide that metallization layers of each of said plurality of photovoltaic cells are at the same potential for RF frequencies of operation.

7. The module according to claim 1, wherein said substrate is a printed circuit board.

8. A method of forming a photovoltaic module comprising:
   forming a plurality of photovoltaic cells on a side of a substrate;
   forming a conductive spacer on said one side of said substrate, wherein said conductive spacer has a thickness substantially equal to a thickness of each of said photovoltaic cells;
   providing an antenna element on said conductive spacer;
   interconnecting said plurality of photovoltaic cells, wherein a top surface of each of said plurality of photovoltaic cells together form a ground plane of said antenna element.

9. The method according to claim 8, wherein said substrate is a printed circuit board.

10. The method according to claim 8, wherein interconnecting said plurality of photovoltaic cells comprises interconnecting circuitry elements positioned on a second side of said substrate.

11. The method according to claim 8, further comprising connecting a negative side of each of said plurality of photovoltaic cells to a ground by a respective capacitor in order that metallization layers of said plurality of photovoltaic cells are at the same potential for frequencies of operation.

12. The method according to claim 8, wherein said antenna element is a patch antenna.

13. The method according to claim 8, wherein said conductive spacer is a copper spacer.

14. A power source, comprising:
    a substrate having a first side and a second side;
    a plurality of photovoltaic cells each having a first side and a second side, wherein each of said first sides of said plurality of photovoltaic cells are coupled to said first side of said substrate;
    a conductive spacer element formed on the first side of said substrate, said conductive spacer having a thickness which is substantially equal to a thickness of each of said plurality of photovoltaic cells; and
    an antenna element formed on said conductive spacer, wherein said second sides of said plurality of photovoltaic cells together form a ground plane for said antenna element.

15. The power source of claim 14 coupled to a radiation sensitive sensor for detecting a physical phenomena, said sensor comprising:
    a single fixed electromagnetic radiation detector sensitive to a narrow band of an electromagnetic radiation spectrum centered about a predetermined frequency of interest associated with said physical phenomena;
    a rotatable infrared radiation directing device receiving infrared radiation from a first predefined angle in a first direction and from a second predefined angle in a second direction perpendicular to said first direction wherein said directing device is rotatable in said second direction and wherein said directing device directs said radiation to said single fixed electromagnetic radiation detector;
    a sector control device for sequentially rotating said directing device in said second direction in a series of increments provide stopping points at each of a plurality of sector, each of said sector receiving radiation from an angle in said second direction equal in value to said second predefined angle;
    an output control device for controlling said sector control device and said radiation detector to provide a series of detected radiation output signal for each of said sectors and for controlling the duration between rotation from one of said sectors to an adjacent one of said sectors; and a signal processing device for analyzing signals output from said detector including a first short term signal analyzing device for measuring signal strength and a second longer term analyzing device for measuring signal information content, both providing an indication of presence or absence of said physical phenomena.

16. The power source of claim 14, further comprising interconnecting circuitry formed on the second side of said substrate to interconnect said plurality of photovoltaic cells.

17. The power source of claim 14, wherein said antenna element is a patch antenna element.

18. The power source of claim 14, wherein said conductive spacer is a copper spacer.

19. The power source of claim 14, wherein said conductive spacer and said antenna element are essentially centrally positioned among said plurality of photovoltaic cells.

20. The power source of claim 14, wherein each of said plurality of photovoltaic cells are connected to a ground through a respective capacitance element in order to provide that metallization layers of each of said photovoltaic cell are at the same potential for RF frequencies of operation.

* * * * *

UNITED STATES PATENT AND TRADEMARK OFFICE
CERTIFICATE OF CORRECTION

| | | |
|---|---|---|
| PATENT NO. | : 7,129,493 B2 | |
| APPLICATION NO. | : 10/898640 | |
| DATED | : October 31, 2006 | |
| INVENTOR(S) | : William R. Garmer et al. | |

It is certified that error appears in the above-identified patent and that said Letters Patent is hereby corrected as shown below:

On the title page, column 1 should read:

Item (12)    United States Patent
                              Garmer et al.

Item (75)    Inventors: William R. Garmer, San Diego, CA (US); Jonathan M. Luck, El Cajon, CA (US)

Signed and Sealed this

Sixth Day of March, 2007

JON W. DUDAS
*Director of the United States Patent and Trademark Office*